United States Patent
Shimizu et al.

(10) Patent No.: US 7,688,242 B2
(45) Date of Patent: Mar. 30, 2010

(54) ANALOG-TO-DIGITAL (AD) CONVERTER AND ANALOG-TO-DIGITAL CONVERSION METHOD

(75) Inventors: Kazuya Shimizu, Kiryu (JP); Haruo Kobayashi, Kiryu (JP); Koichiro Mashiko, Takarazuka (JP)

(73) Assignee: Semiconductor Technology Academic Research Center, Yokohama-Shi (JP)

( * ) Notice: Subject to any disclaimer, the term of this patent is extended or adjusted under 35 U.S.C. 154(b) by 42 days.

(21) Appl. No.: 12/076,270

(22) Filed: Mar. 14, 2008

(65) Prior Publication Data
US 2008/0238752 A1    Oct. 2, 2008

(30) Foreign Application Priority Data
Mar. 26, 2007    (JP) ............................. 2007-078969

(51) Int. Cl.
*H03M 1/12*    (2006.01)
(52) U.S. Cl. ........................ 341/155; 341/122
(58) Field of Classification Search ................. 341/155, 341/143, 144, 118, 119, 120, 121, 122
See application file for complete search history.

(56) References Cited

U.S. PATENT DOCUMENTS

| | | | | |
|---|---|---|---|---|
| 5,287,171 | A * | 2/1994 | Ohtsubo et al. ............. | 348/500 |
| 6,593,871 | B1 * | 7/2003 | Miethig et al. ............... | 341/157 |
| 7,262,723 | B2 * | 8/2007 | Straussnig et al. .......... | 341/120 |
| 2008/0143563 | A1 | 6/2008 | Suyama | |
| 2008/0158032 | A1 * | 7/2008 | Mayrench et al. ........... | 341/152 |
| 2008/0207160 | A1 | 8/2008 | Toraichi et al. | |

FOREIGN PATENT DOCUMENTS

| | | |
|---|---|---|
| JP | 9-64197 | 3/1997 |
| JP | 2006-41878 | 2/2006 |
| WO | WO 2006/131962 | 12/2006 |

OTHER PUBLICATIONS

K. Nose, M. Kajita, M. Mizuno, "A 1-ps Resolution Jitter-Measurement Macro Using Interpolated Jitter Oversampling", IEEE JSSC, vol. 41, No. 12, pp. 2911-2920 (Dec. 2006).
J. Rivoir, "Fully-Digital Time-To-Digital Converter for ATE with Autonomous Calibration", IEEE International Test Conference, Santa Clara (Oct. 2006).
J. Rivoir, "Statistical Linearity Calibration of Time-To-Digital Converters Using a Free-Running Ring Oscillator" 15th Asian Test Symposium (2006).

* cited by examiner

*Primary Examiner*—Brian Young
(74) *Attorney, Agent, or Firm*—Staas & Halsey LLP (57) ABSTRACT

An AD converter that operates at high speed and precision of which is disclosed. The AD converter includes an analog-to-digital (AD) conversion part that samples an analog signal according to a sampling clock and converts it into a digital signal, a jitter measuring circuit that measures the jitter of the sampling clock, and a correction circuit that corrects a digital signal output from the AD conversion part. The AD converter further comprises a clock source and a sampling generating circuit that generates a sampling clock by dividing the clock generated by the clock source, wherein the jitter measuring circuit measures the jitter of the sampling clock with respect to the click on the basis of a clock CK.

4 Claims, 13 Drawing Sheets

FIG. 2A

FIG. 2B $\quad V = A\sin(2\pi f_{in} t)$

FIG. 2C $\quad dv/dt = 2\pi f_{in} A\cos(2\pi f_{in} t)$

FIG. 2D

FIG. 2E  $\quad dV = 2\pi f_{in} A \delta_t$

FIG. 2F $\quad SNR_{jitter} = -20\log(2\pi f_{in} A \delta_t)$

FIG.9A $\tau_1 > \tau_2$

INTERPOLATION

ANALOG-TO-DIGITAL (AD) CONVERTER AND ANALOG-TO-DIGITAL CONVERSION METHOD

CROSS-REFERENCE TO RELATED APPLICATION

This application is based upon and claims the benefit of priority from prior Japanese Patent Application No. 2007-078969, filed in Mar. 26, 2007, the entire contents of which are incorporated herein by reference.

BACKGROUND OF THE INVENTION

The present invention relates to an analog-to-digital (AD) converter and an analog-to-digital conversion method, and more specifically, to a technique to correct the influence of jitter of a sampling clock.

Recently, the performance of an AD converter has been improved remarkably; however, when a high-frequency input signal is subjected to AD conversion, there arises a serious problem of degradation of precision in which the jitter of a sampling clock causes an error of amplitude. The influence of jitter of a sampling clock is increased in a high-frequency signal and a large-amplitude signal, of which the slew rate of input signal is large, and the SNR (Signal to Noise Ratio) of an AD converter is degraded. In order to prevent such a problem from arising, it is necessary to reduce the jitter of a sampling clock; however, such a sampling clock is difficult to supply and particularly, there is a problem in that it is difficult to supply a sampling clock with small jitter on an Soc (System-on-Chip).

When an analog signal to be subjected to AD conversion is sampled at the rise of a sampling clock (it can also be sampled at the fall), the jitter of the sampling clock is the fluctuation of the rise in timing of the sampling clock from the reference timing. As described in, for example, K. Nose, M. Kajita, M. Mizuno, "A 1 ps-Resolution Jitter-Measurement Macro Using Interpolated Jitter Oversampling", IEEE JSSC, vol. 41, no. 12, pp. 2911-2920 (December 2006) etc., the fluctuations include jitter of time difference from the reference (ideal) timing and jitter of the length of each cycle. The "time difference of the actual rise timing of clock from the reference timing" is defined as jitter.

Figure 1:
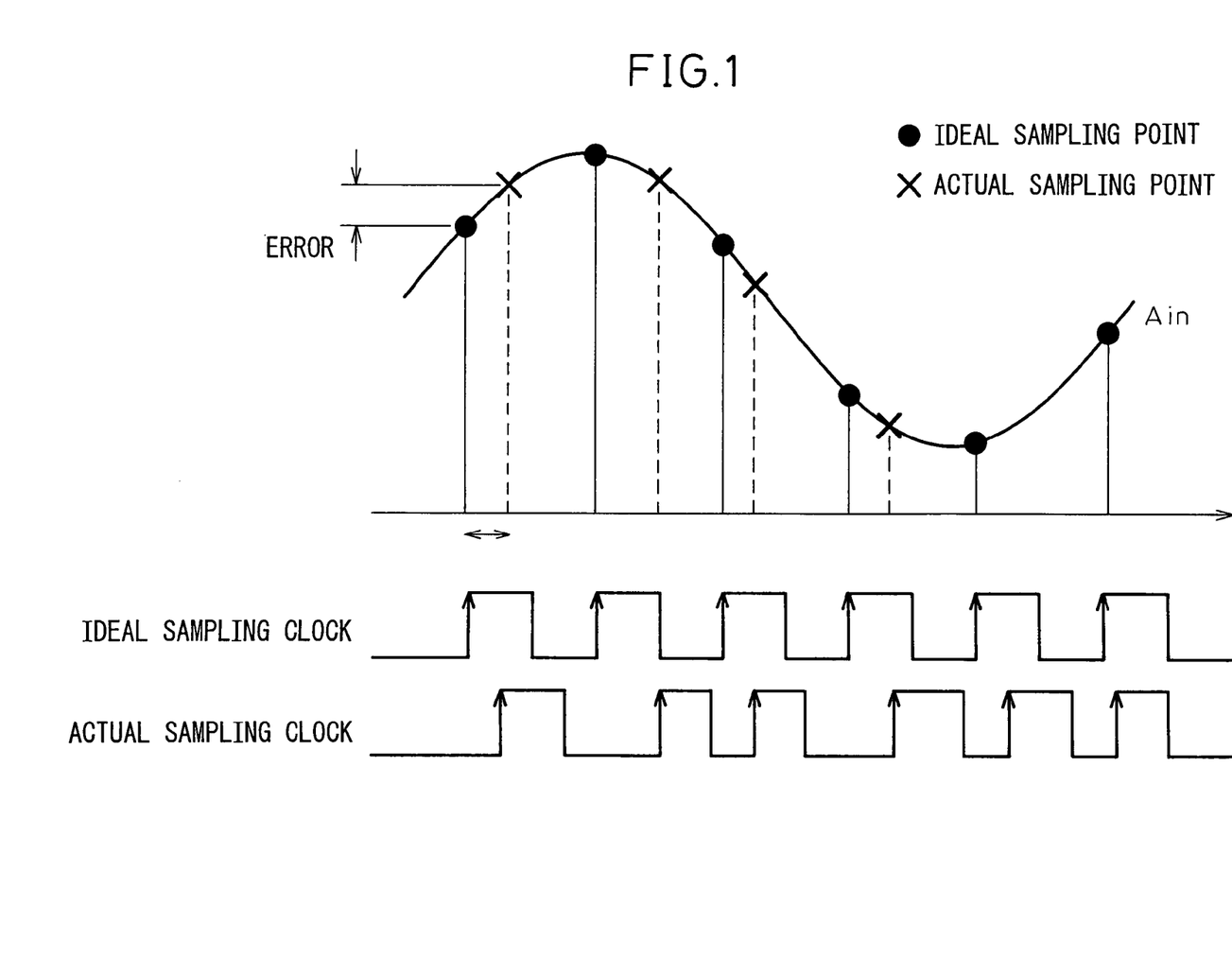
FIG. 1 is a diagram explaining the occurrence of errors owing to the jitter of a sampling clock in AD conversion processing.

FIG. 1 is a diagram explaining an error by the jitter of a sampling clock. As shown schematically, when sampled with an ideal sampling clock without jitter, an amplitude value shown by a circle of an input signal Ain is sampled; however, jitter is included in an actual sampling clock, and therefore, an amplitude value shown by a cross mark is sampled, and because of this, an error is produced in the sampled amplitude value, resulting in the production of an error in the output of AD conversion.

Figure 2A:
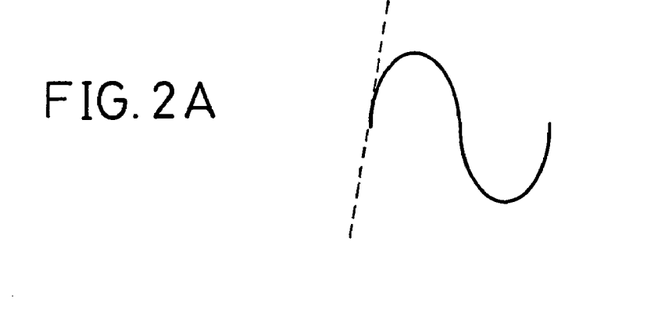
FIGS. 2A to 2F are diagrams explaining an amount of error owing to the jitter of a sampling clock in the AD conversion processing.
Figure 2B:
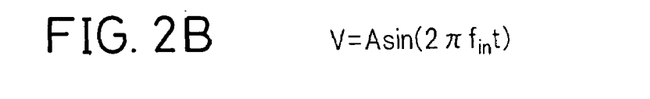

In order to discuss the influence of jitter, it is assumed that a voltage value V of the input signal Ain changes in a sinusoidal waveform with an amplitude A. Voltage signal V is expressed by the following expression as shown in FIG. 2B.

$$V = A \sin(2\pi f_{in} t)$$

Figure 2C:
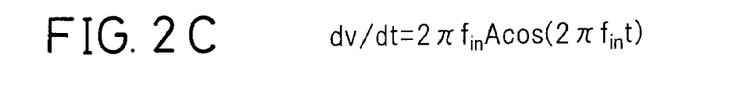

The rate of change of voltage signal V is a derivative of V with respect to time, and therefore, expressed by the following expression as shown in FIG. 2C.

$$dV/dt = 2\pi f_{in} A \cos(2\pi f_{in} t)$$

The rate of change dV/dt is largest, i.e., the influence of jitter is largest when $\cos(2\pi f_{in} t) = 1$. Hereinafter, the case where the influence is largest is discussed, and therefore, $dV/dt = 2\pi f_{in} A$.

Figure 2D:
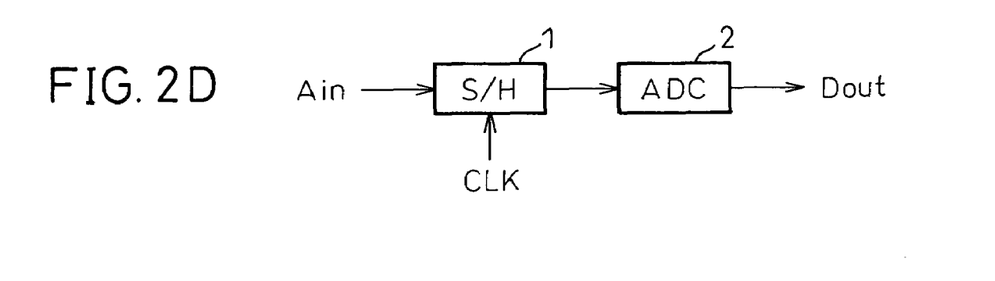

It is assumed that an AD converter is configured so that the analog input signal Ain is input to a sample and hold (S/H) circuit 1, sampled according to a clock CLK, and the held voltage is converted into a digital output signal Dout in an analog-to-digital conversion (ADC) part 2, as shown in FIG. 2D.

Figure 2E:
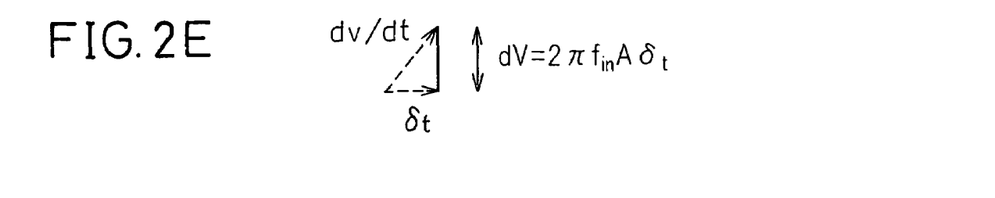

When a sampling clock includes jitter $\delta_t$, an amplitude error dV that occurs in the sampling value is the gradient dV/dt multiplied by $\delta_t$ at most, and expressed by the following expression.

$$dV = 2\pi f_{in} A \delta_t$$

Figure 2F:
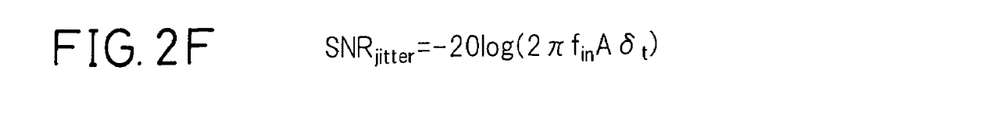

From this, the SNR (Signal to Noise Ratio) of the AD converter is expressed as shown in FIG. 2F.

$$SNR_{jitter} = -20 \log(2\pi f_{in} A \delta_t)$$

Figure 3:
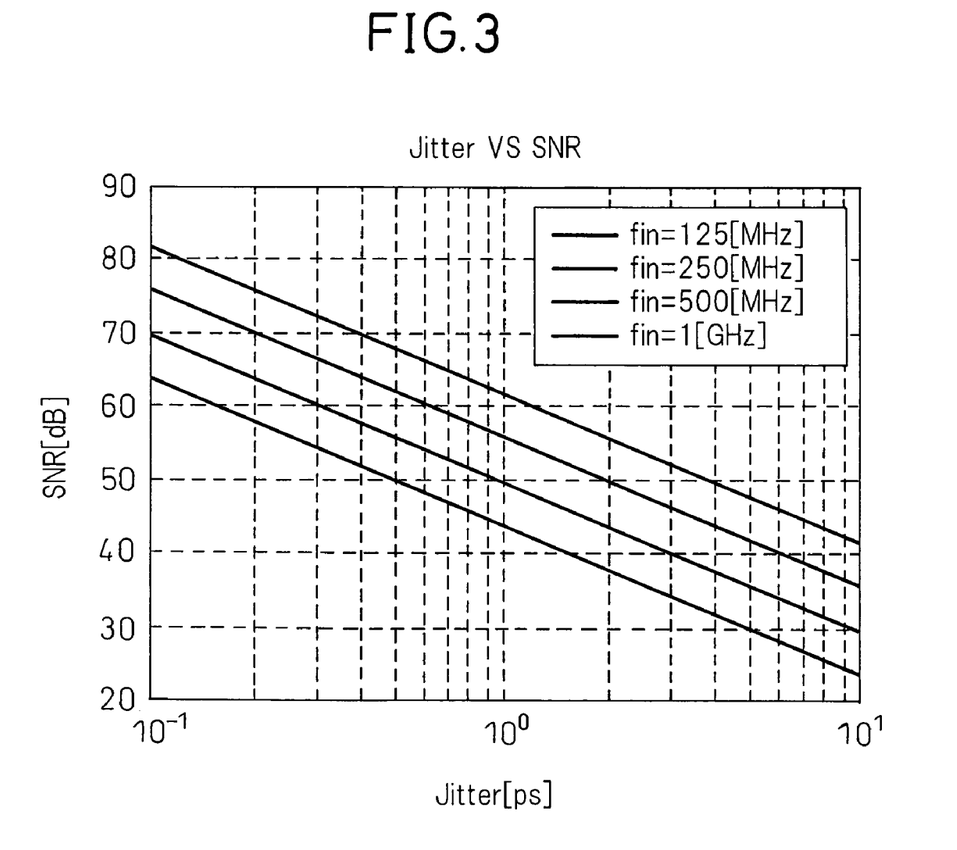
FIG. 3 is a diagram explaining an SNR owing to the jitter of a sampling clock in the AD conversion processing.

FIG. 3 is a diagram showing the change in SNR with respect to the magnitude of jitter for different frequencies $f_{in}$ of the input analog signal Ain based on the above expression. From the figure, it can be seen that the error caused by jitter becomes larger the greater the jitter and amplitude A are, and the higher the frequency $f_{in}$ is.

SUMMARY OF THE INVENTION

Recently, due to miniaturization of the process technique and ingenuity of architecture/circuit configuration, an attempt has been made to increase the operating frequency of an AD converter, and as a result, the above amplitude A and frequency $f_{in}$ increase, causing a problem of the degradation of precision of an AD converter caused by jitter in the sampling frequency.

An object of the present invention is to improve the precision of an AD converter that operates at high speed.

In order to achieve the above-mentioned object, an AD converter and an AD conversion method of the present invention are characterized in that the jitter of a sampling clock in which an analog signal sampled is measured, and based on the measured jitter, a digital signal, which is an output of AD conversion is corrected.

In other words, the AD converter according to the present invention is characterized by comprising an analog-to-digital (AD) conversion part that samples an analog signal according to a sampling clock and converts it into a digital signal, a jitter measuring circuit that measures the jitter of the sampling clock, and a correction circuit that corrects the digital signal output by the AD conversion part based on the jitter measured in the jitter measuring circuit.

According to the present invention, even if jitter is included in a sampling clock, a digital output signal is corrected based on measured jitter, and therefore, it is possible to remove an error caused by jitter and essentially improve precision.

In a conventional AD conversion system, an error correction of a digital output signal based on measured jitter by measuring jitter in a sampling clock is not carried out. The reason why it is not carried out resides in a paradox that "in order to measure jitter in a sampling clock, a reference clock without jitter is necessary, and if there is a reference clock without jitter available, it may be used as a sampling clock of AD conversion". In order to resolve such a paradox, in the present invention, jitter in a sampling clock is measured in the following two aspects explained below.

In a first aspect, there are provided a clock source that generates a high-frequency clock as a reference and a sampling clock generating circuit that divides the clock generated by the clock source to generate a sampling clock, and a jitter measuring circuit measures jitter of the sampling clock for the clock using the clock as a reference.

According to the first aspect, a higher frequency signal has smaller jitter, and therefore, it is used as a reference clock and the jitter of lower frequency sampling clock is measured using a time digitizer.

In the case where the AD converter of the present invention is realized by an SoC, the clock source is a PLL (Phase locked Loop), DLL (Delay Locked Loop), etc. provided on a chip, and generates a multiple-frequency signal from the clock supplied from outside.

According to a second aspect, on the basis of a delayed sampling clock delayed by substantially one cycle from the sampling clock, the jitter of the sampling clock for the delayed sampling clock is measured.

According to the second aspect, each cycle of the sampling clock is measured digitally for each time. In other words, the time interval between the rise in timing immediately before the sampling clock and the current rise timing is measured by the time digitizer circuit. The timing immediately before the sampling clock will be a reference clock.

As described in K. Nose, M. Kajita, M. Mizuno, "A 1 ps-Resolution Jitter-Measurement Macro Using Interpolated Jitter Oversampling", IEEE JSSC, vol. 41, no. 12, pp. 2911-2920 (December 2006), J. Rivoir, "Fully-Digital Time-to-Digital Converter for ATE with Autonomous Calibration", IEEE International Test Conference, santa Clara, (October 2006), J. Rivoir, "Statistical Linearity Calibration of Time-to-Digital Converters Using a Free-Running Ring Oscillator", 15th Asian Test Symposium (2006), the time resolution of a time digitizer has recently been improved up to about 10 ps to 1 ps and it is possible to apply these techniques to the jitter measuring circuit of the AD converter of the present invention.

The jitter correction circuit, for example, moves the time axis of the AD conversion output by the amount of measured jitter to calculate a correction sampling point, calculates a correction curve, such as a spline curve adapted to a plurality of neighboring correction sampling points, and takes a value at an ideal sampling point on the calculated correction curve as a correction value. The jitter correction circuit is realized by, for example, a DSP (Digital Signal Processor).

Various digital interpolation algorithms have been proposed and such techniques can be applied to the jitter correction circuit of the AD converter of the present invention.

According to the present invention, it is possible to realize a high-speed AD converter with high precision even if a circuit that generates a sampling clock is simplified because errors owing to jitter can be removed and precision can be improved essentially even if jitter is included in the sampling clock.

BRIEF DESCRIPTION OF THE DRAWINGS

The features and advantages will be more clearly understood from the following description taken in conjunction with accompanying drawings, in which.

DESCRIPTION OF THE PREFERRED EMBODIMENTS

Figure 4:
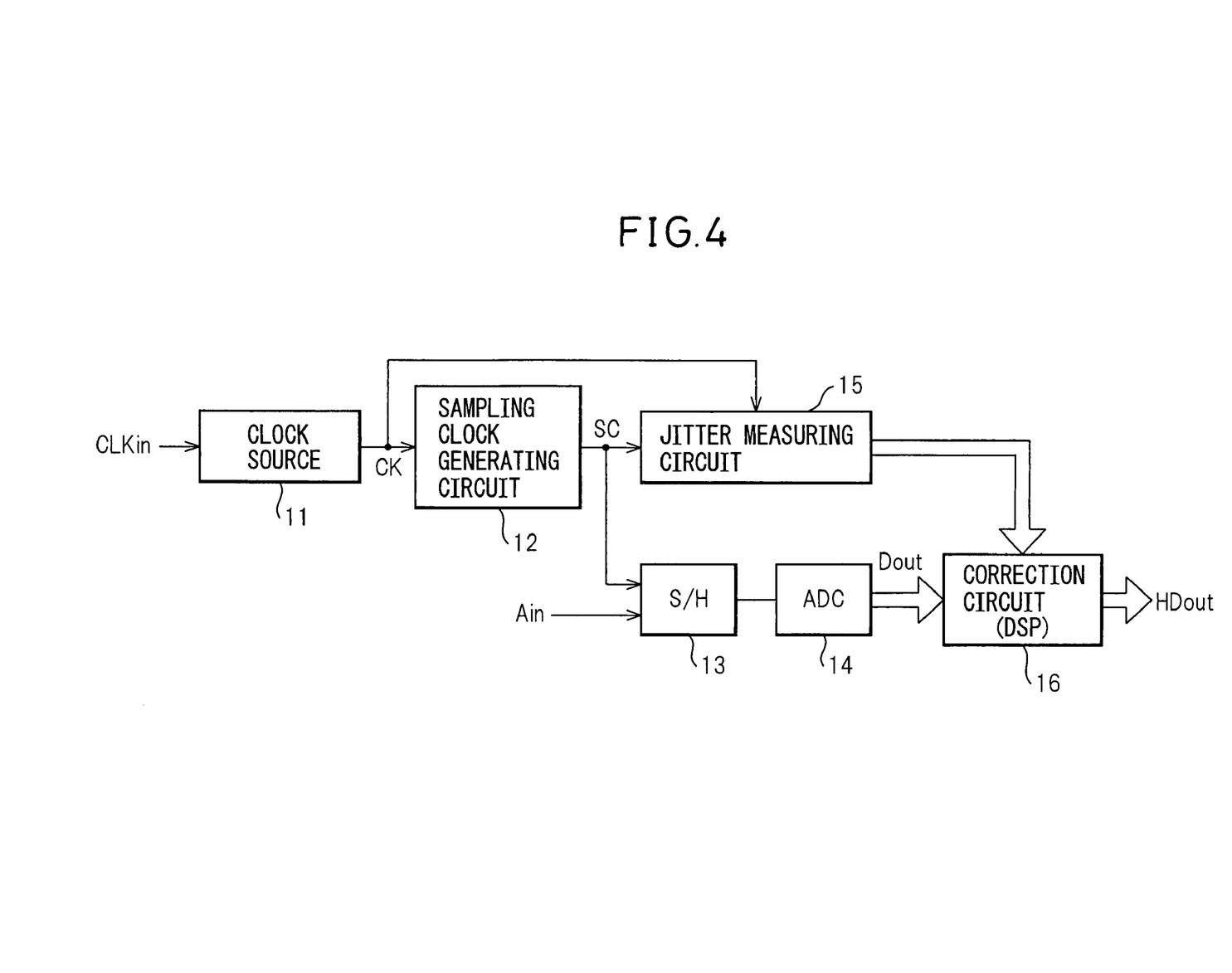
FIG. 4 is a diagram showing a basic configuration of an AD converter in a first embodiment of the present invention.

FIG. 4 is a diagram showing a basic configuration of an analog-to-digital (AD) converter of a first embodiment of the present invention. The AD converter is mounted on, for example, a chip as part of an SoC.

As shown in FIG. 4, the AD converter of the first embodiment has a clock source 11 to which a clock CLKin supplied from outside the chip is input and which generates a multiple-frequency original clock CK; a sampling clock generating circuit 12 that divides original clock CK and generates a sampling clock SC; a sample and hold (S/H) circuit 13 to which an analog input signal Ain is input and which samples the analog input signal Ain with the rise timing of sampling clock SC and holds it; an AD conversion part (ADC) 14 that converts the analog signal held in S/H circuit 13 into a digital signal and outputs a digital output signal Dout; a jitter measuring circuit 15 that measures jitter for original clock CK of sampling clock SC; and a correction circuit 16 that corrects digital output signal Dout output by ADC 14 based on the jitter measured by jitter measuring circuit 15 and generates a corrected digital output signal HDout. Correction circuit 16 is realized by, for example, a DSP.

Figure 5A:
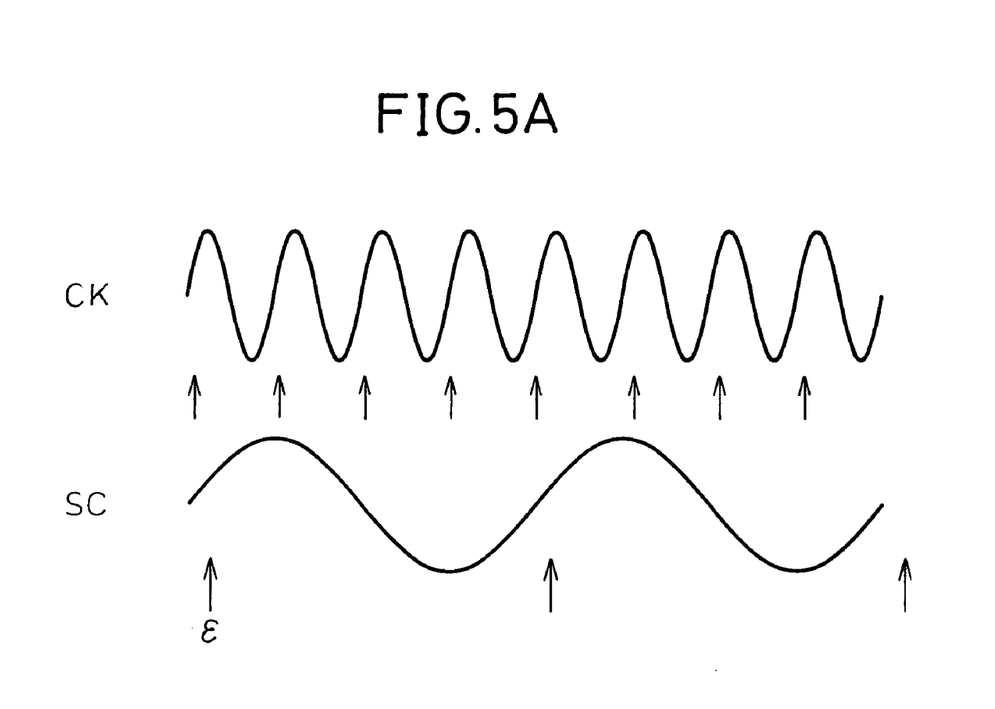
FIGS. 5A and 5B are diagrams explaining the principle underlying the first embodiment.
Figure 5B:
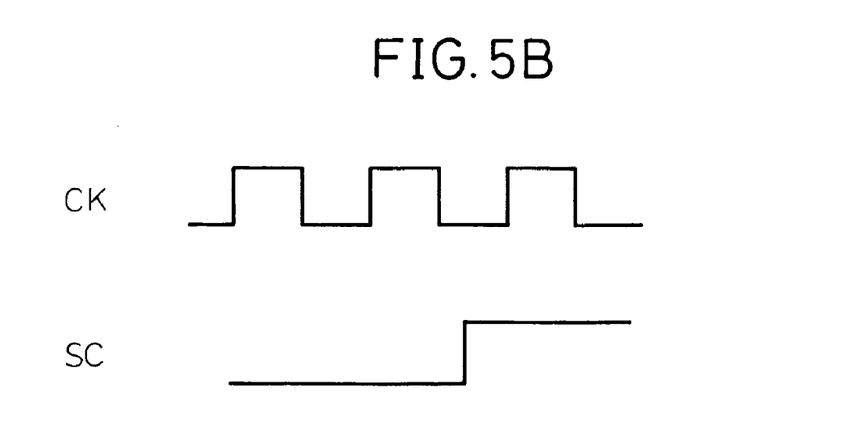

FIGS. 5A and 5B are diagrams explaining the principle of the first embodiment.

It is known that a clock generated by the clock generating circuit has when it has a high frequency, a waveform near a sinusoidal wave in a chip as shown in FIG. 5, and as the frequency increases, the slew rate becomes higher, and therefore, jitter becomes smaller. The standard deviation of the jitter of a high-frequency signal is inversely proportional to the root of the frequency. This is explained by using Allan variance, in which the shift in timing (shift in timing when the clock crosses the threshold value between logical levels "0" and "1") due to the influence of thermal noises becomes small.

As a result, as shown in FIG. 5A, original clock CK is a high-frequency signal with less jitter and sampling clock SC has a lower frequency compared to that of original clock CK and therefore jitter becomes larger relatively. Consequently, clock source 11 is a circuit that generates original clock CK with a large slew rate, a high frequency, and a large amplitude, and the jitter of original clock CK to be generated is small. On the other hand, S/H circuit 13 is a circuit that samples analog input signal Ain, which is a high-frequency signal with a large slew rate, and therefore, errors caused by jitter become larger.

Although original clock CK and sampling clock SC are high-frequency signals and their waveform is a sinusoidal wave, as described above, it is assumed that they are represented by a rectangular wave hereinafter as shown in FIG. 5B.

Figure 6:
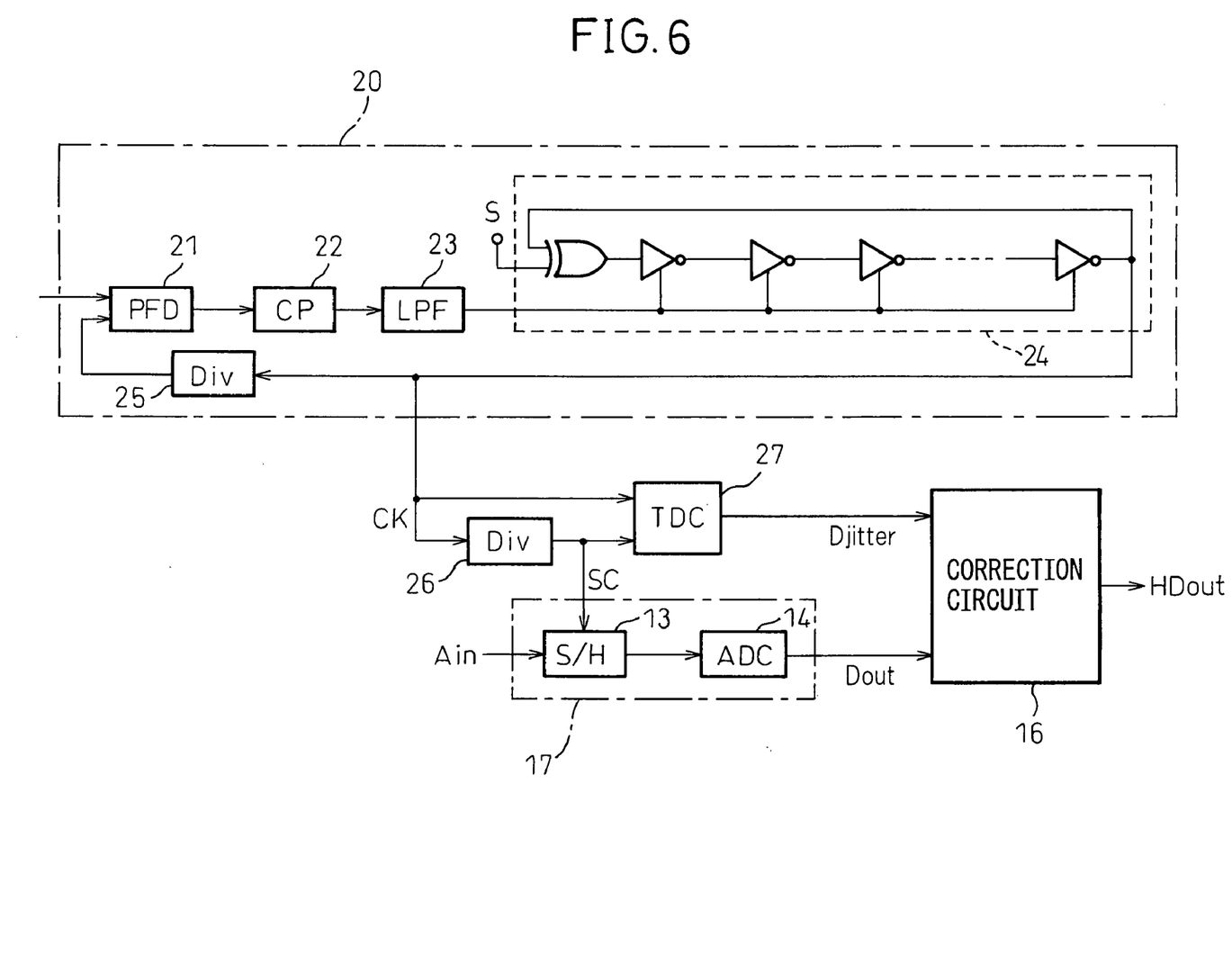
FIG. 6 is a diagram showing a configuration of the AD converter in the first embodiment.

FIG. 6 is a diagram showing a more detailed configuration of the AD converter in the first embodiment. In FIG. 6, clock source 11 corresponds to a PLL circuit 20, sampling clock generating circuit 12 corresponds to a divider (Div) 26, and jitter measuring circuit 15 corresponds to a time-to-digital converter (TDC). The combination of S/H circuit 13 and ADC 14 is referred to as an analog-to-digital (AD) conversion part 17 here.

PLL circuit 20 has a phase frequency detector (PFD) 21; a charge pump circuit (CP) 22; a low pass filter (LPF) 23; a voltage control oscillator (VCO) 24; and a divider (Div) 25; and generates multiple-frequency original clock CK of clock signal CLKin supplied from outside. In VCO 24, a plurality (even number) of inverters and EXOR gates are connected in the form of a ring. When an input S on one side of the EXOR gate is turned to "H" level, the VCO 24 becomes a state equivalent to that is brought about in which an odd number of inverters are connected in the form of a ring, and therefore, oscillation is caused and an original clock is generated. The period of the original clock is a total of delayed times of the inverter EXOR gates. When input S on the one side of the EXOR gate is turned to "L" level, the oscillation is terminated.

Figure 7A:
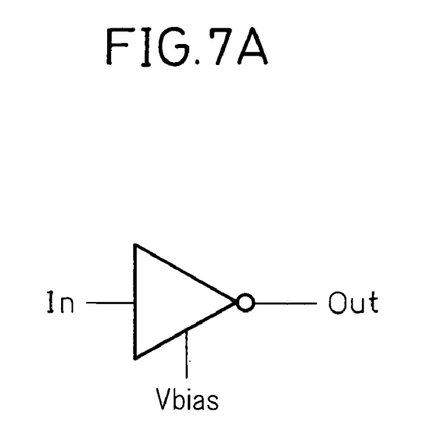
FIGS. 7A to 7D are diagrams showing a configuration example of a variable delay amount inverter that constitutes a VCO in the first embodiment.
Figure 7B:
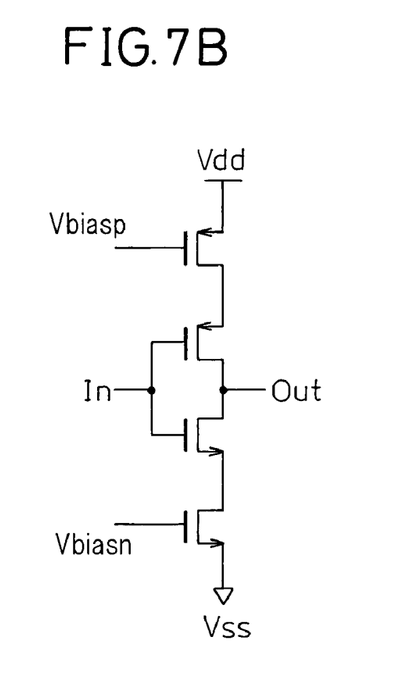
Figure 7C:
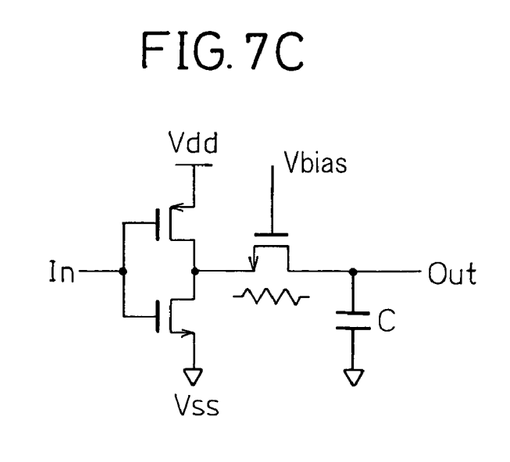
Figure 7D:
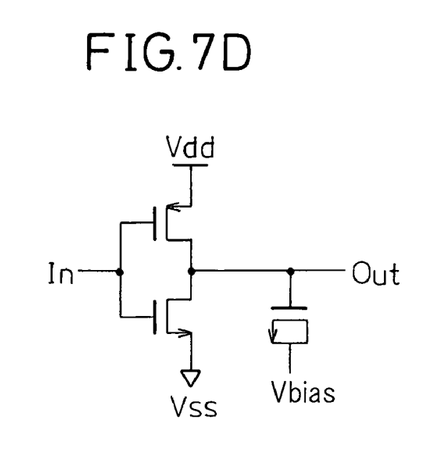

As shown in FIG. 7A, the inverter of VCO 24 is a variable delay inverter that reverses an input signal In and outputs it as an output signal Out and the delay time of which is changed by changing a bias Vbias. FIGS. 7B to 7D show configuration examples that realize the variable delay converter in FIG. 7A.

FIG. 7B shows a circuit, in which a P channel transistor to which a gate voltage Vbiasp is applied is connected between a P channel transistor constituting an inverter and a high potential power supply Vdd, and an N channel transistor to which a gate voltage Vbiasn is applied is connected between an N channel transistor constituting the inverter and a low potential power supply Vss, and by changing Vbiasp and Vbiasn, the delay time of the inverter changes.

FIG. 7C shows a circuit, in which a transistor to which gate voltage Vbias is applied and a capacitor (may be a parasitic capacitor) are connected to the output of the inverter, and the transistor acts as a resistor and by changing Vbias, the resistance value changes and the delay time of the inverter changes.

FIG. 7D is a circuit, in which a transistor to which gate voltage Vbias is applied is connected to the output of the inverter, and the transistor acts as a capacitor and by changing Vbias, the capacitance value changes and the delay time of the inverter changes.

It is assumed that VCO 24 oscillates at a high frequency of 8 GHz and original clock CK has a frequency of 8 GHz.

Because the PLL circuit explained above is widely known, its detailed explanation is omitted.

Div 26 divides the original clock CK into 32 pieces and generates sampling clock SC having a frequency of 250 MHz.

Figure 8A:
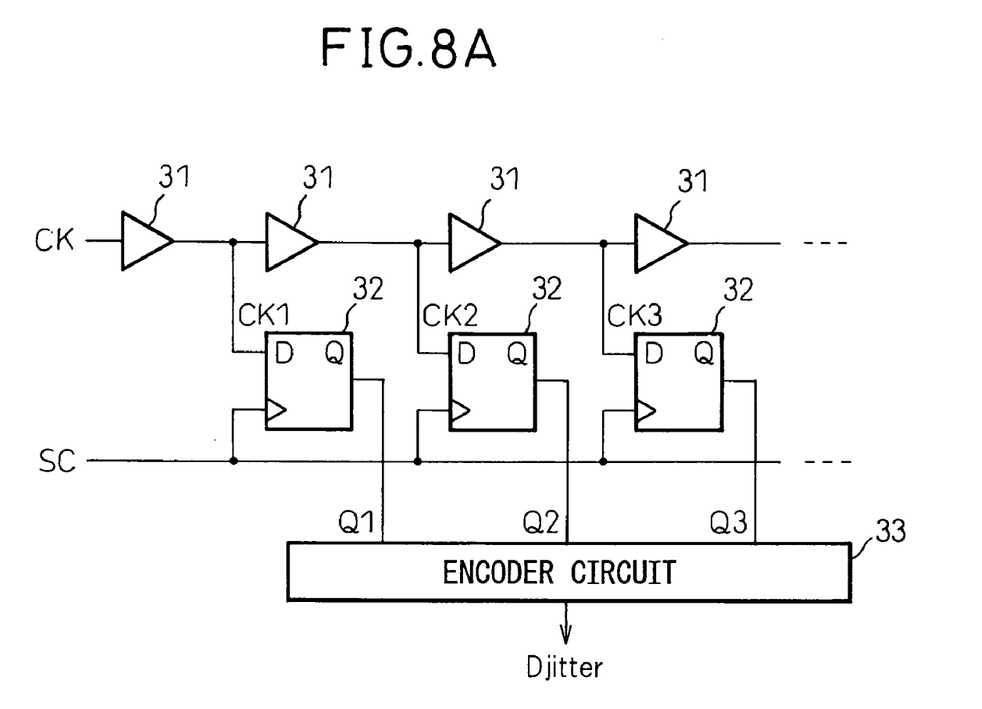
FIGS. 8A and 8B are diagrams showing a configuration and operation of a jitter measuring circuit (TDC) in the first embodiment.
Figure 8B:
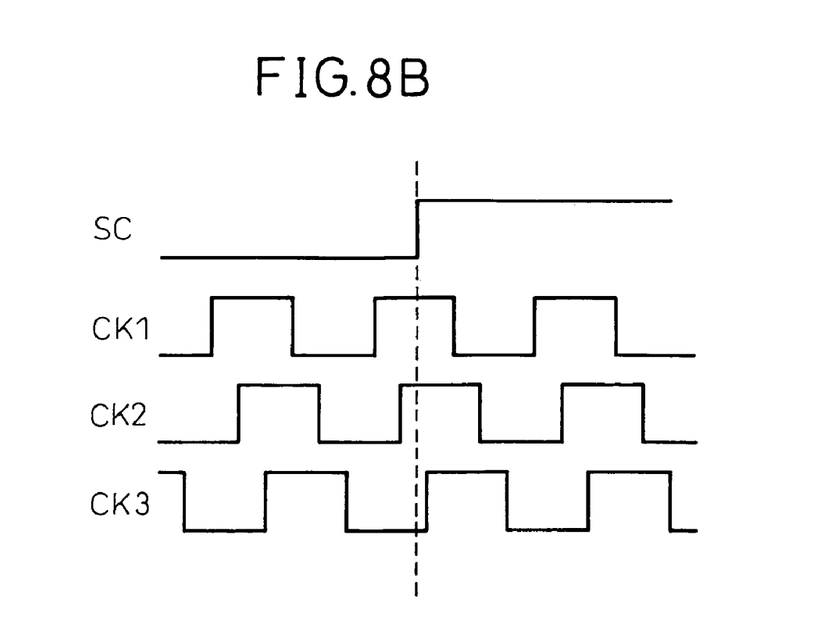

FIGS. 8A and 8B are diagrams showing configuration and operation of a TDC 27, FIG. 8A showing a circuit configuration and FIG. 8B showing a time chart of the circuit operation.

As shown in 8A, TDC 27 has a delay circuit series in which a plurality of non-inverter buffers 31 that sequentially delay original clock CK by a delay time $\tau 1$ are connected in series; a plurality of flip-flops 32 that take each of delayed clocks CK1, CK2, CK3, delayed sequentially by the delay circuit series as a data input and sampling clock SC as a clock input; an encoder circuit 32 that calculates the jitter of the sampling clock for original clock CK from outputs Q1, Q2, Q3, . . . , of the plurality of flip-flops 32.

Non-inverter buffer 31 is realized, for example, by connecting two inverters or by using such a circuit as described in Japanese Unexamined Patent Publication (Kokai) No. H9-64197. The number of non-inverter buffers 31 to be connected needs to be equal to or more than the number, which is a predicted magnitude of the jitter of sampling clock SC divided by the amount of delay of non-inverter buffers 31 plus a predetermined number as a margin.

As shown in FIG. 8B, delayed clocks CK1, CK2, CK3, . . . , output from each of non-inverter buffers 31 are delayed by a predetermined amount of delay. When sampling clock SC rises, delayed clocks CK1, CK2 before a certain delayed clock are in the "high (H)" state and outputs Q1, Q2 of flip-flop 32 will be "H"; however, delayed clocks CK3, . . . , after the certain delayed clock are in the "low (L)" state and outputs Q3, . . . , of flip-flop 32 are in the "L" state, and thereby, it is possible to detect the timing with which sampling clock SC rises with respect to original clock CK by detecting the position at which the output of flip-flop 32 changes by encoder circuit 33. If jitter is present at the rise of sampling clock SC, the position at which the output of flip-flop 32 changes is different and therefore the output of encoder circuit 33 changes as a result.

In the configuration of TDC 27 in FIG. 8A, the detection resolution of jitter of sampling clock CS is an amount of delay of non-inverter buffer 31.

Figure 9A:
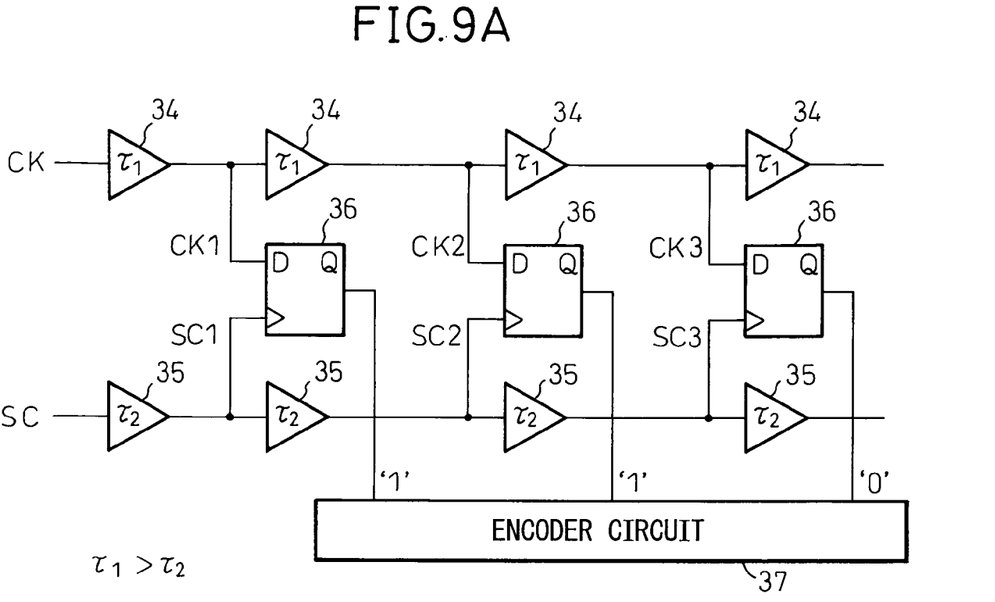
FIGS. 9A and 9B are diagrams showing a configuration and operation of a modification example of the jitter measuring circuit (TDC) in the first embodiment.
Figure 9B:
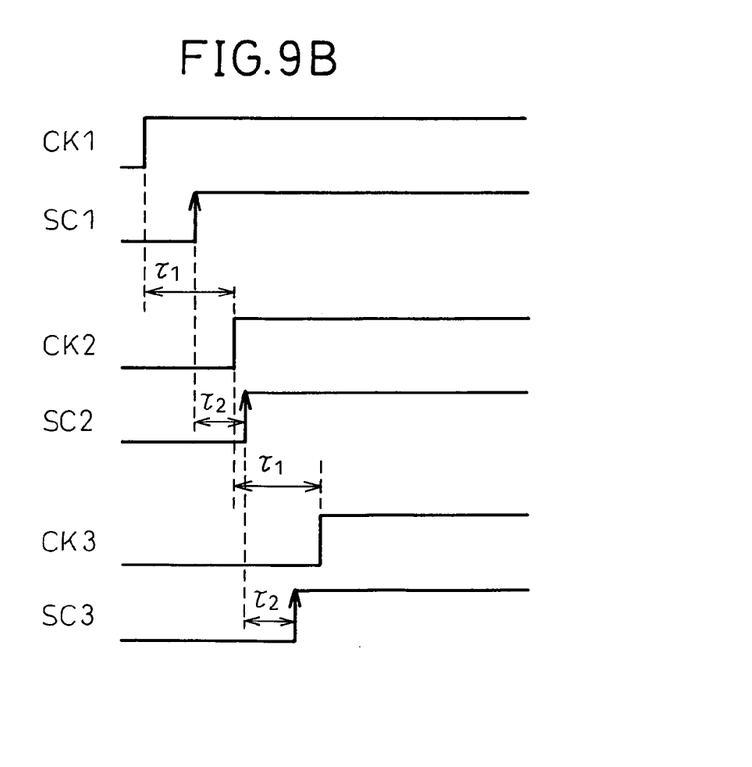

FIGS. 9A and 9B are diagrams showing the configuration and operation of TDC 27, the resolution of which has been improved, FIG. 9A showing a circuit configuration and FIG. 9B showing a time chart of the circuit operation.

As shown in FIG. 9A, TDC 27 in a modification example has a first delay circuit series in which a plurality of non-inverter buffers 34 that sequentially delay original clock CK by first predetermined delay time $\tau 1$ are connected in series; a second delay circuit series in which a plurality of non-inverter buffers 35 that sequentially delay sampling clock SC by a second predetermined delay time $\tau 2$ are connected in series; a plurality of flip-flops 36 that take each of delayed clocks CK1, CK2, CK3, . . . , delayed sequentially by the first delay circuit series as a data input and each of delayed sampling clocks SC1, SC2, SC3, . . . , delayed sequentially by the second delay circuit series as a clock input; and encoder circuit 37 that calculates jitter of the sampling clock with respect to clock CK from outputs Q1, Q2, Q3, . . . , of the plurality of flip-flops 36. First predetermined delay time $\tau 1$ is longer than second predetermined delay time $\tau 2$ ($\tau 1 > \tau 2$). The number of non-inverter buffers 34, 35 to be connected needs to be equal to or more than the number, which is a predicted magnitude of the jitter of sampling clock SC divided by a difference between the amounts of delay of non-inverter buffers 34 and 35 plus a predetermined number as a margin.

As shown in FIG. 9B, delayed clocks CK1, CK2, CK3, . . . , output from each of non-inverter buffers 34 is delayed by $\tau 1$ and delayed sampling clocks SC1, SC2, SC3, . . . , output from each of non-inverter buffers 35 are delayed by $\tau 2$. As described above, because $\tau 1 > \tau 2$, even if CK1 has risen prior to SC1, the difference between the timing with which CK rises and the timing with which SC rises gradually becomes smaller and soon changes so that SC3 will rise prior to CK3 eventually. In accordance with this, outputs Q1, Q2 of flip-flop 36 turn to "H", however, outputs Q3, . . . , after those of flip-flop 36 turn to "L". By detecting a position at which the output of flip-flop 36 changes using encoder 37, it is possible to detect the timing of change with which delayed sampling clock SC rises prior to delayed clock CK. In the configuration of TDC 27 in FIG. 9A, the detection resolution of jitter of sampling clock SC is a difference between amounts of delay of non-inverter buffer 35 and non-inverter buffer 35. As a result, by appropriately selecting amount of delay of non-inverter buffer 35 and non-inverter buffer 35, the measurement of jitter with high resolution is possible.

In TDC 27 in FIG. 9A, the first delay circuit series in which the plurality of non-inverter buffers 34 for delaying original clock CK are connected in series is provided; however, because VCO 24 also has the delay circuit series of original clock CK as shown in FIG. 6, it is possible to make the circuit scale smaller by integrating these series.

Figure 10:
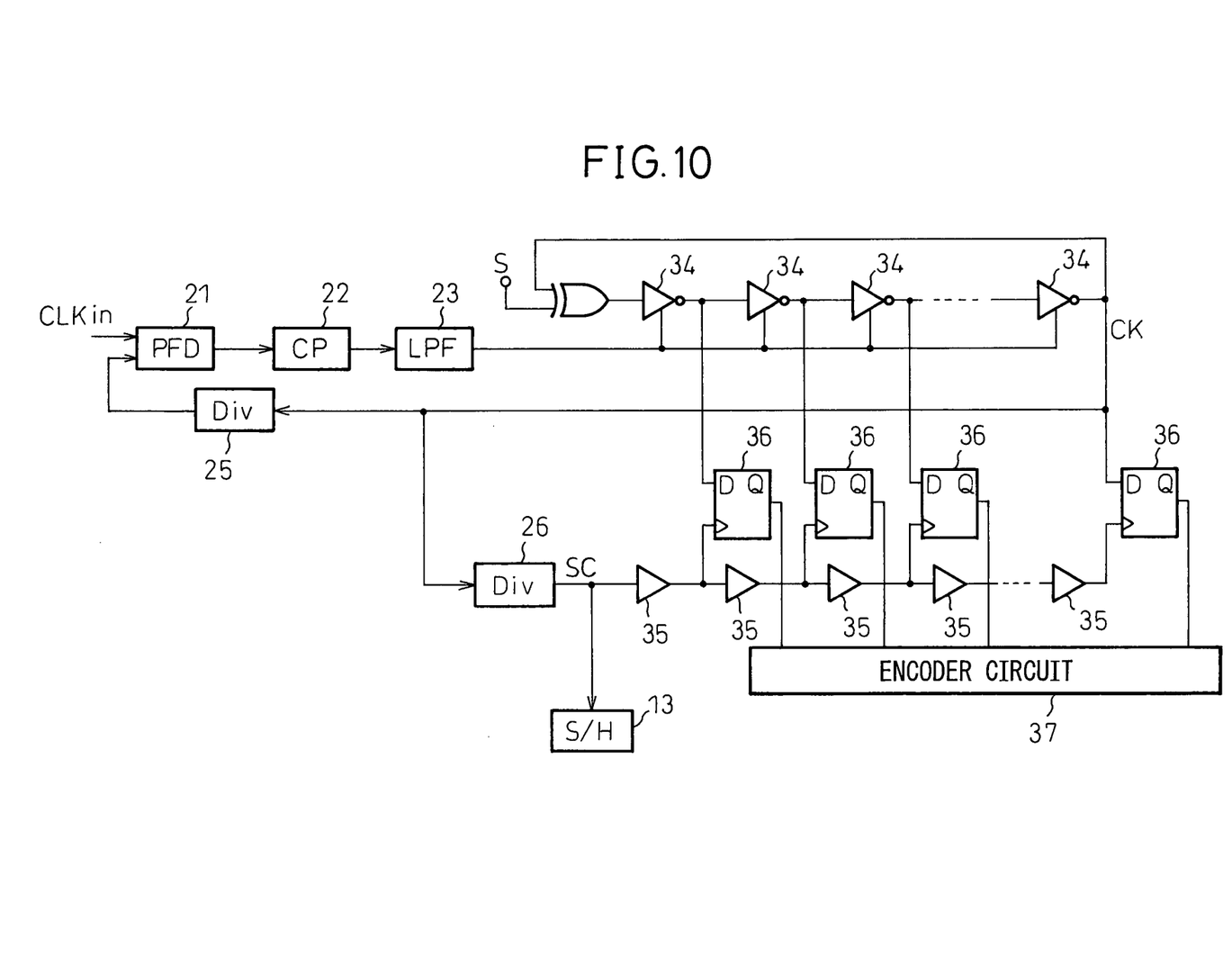
FIG. 10 is a diagram showing a configuration of a modification example of the AD converter in the first embodiment.

FIG. 10 is a diagram showing a configuration in a modification example of the AD converter the circuit scale of which has been made smaller by sharing the delay circuit series of VCO 24 and the first delay circuit series of TDC 27.

In VCO 24 in FIG. 6, an even number of inverters and one EXOR gate are connected in the form of a ring. One non-inverter buffer consisting of two inverters can be constituted and therefore the inverters of VCO 24 constitute non-inverter buffers 34 of the first delay circuit series of TDC 27 in FIG. 9.

As described above, TDC 27 has a delay circuit series in which non-inverter buffers are connected in series and the amount of delay of the non-inverter buffer relates to the detection resolution of the jitter of sampling clock SC. When it is necessary to set the amount of delay of the non-inverter buffer precisely, for example, a switching switch is provided at the input and output of the delay circuit series, respectively, by using a non-inverter buffer in which two inverters with variable delay amount as shown in FIG. 7A are connected and a PLL circuit as shown in FIG. 6 is constituted by the delay circuit series, and thereby, the amount of delay of the non-inverter buffers constituting the delay circuit series is set precisely by measuring the period of the clock generated therefrom. In addition, there are variations in the amounts of delay of each non-inverter buffer constituting the delay circuit series, and if errors owing to the variations are to be taken into consideration, the shifts when oscillation is caused at different periods are processed and calculated statistically.

Next, the processing in correction circuit 16 will be explained with reference to FIGS. 11A and 11B. Correction circuit 16 is configured by, for example, a DSP and corrects digital data Dout from ADC 14 based on measured jitter data Djitter from TDC 27.

Figure 11A:
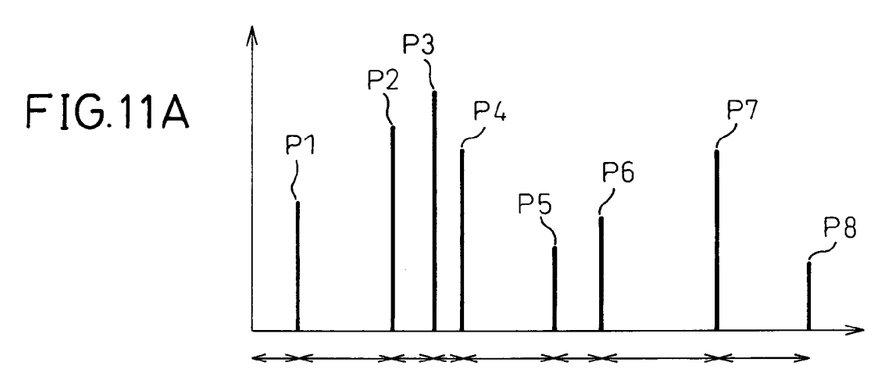
FIGS. 11A and 11B are diagrams explaining correction processing in the first embodiment.
Figure 11B:
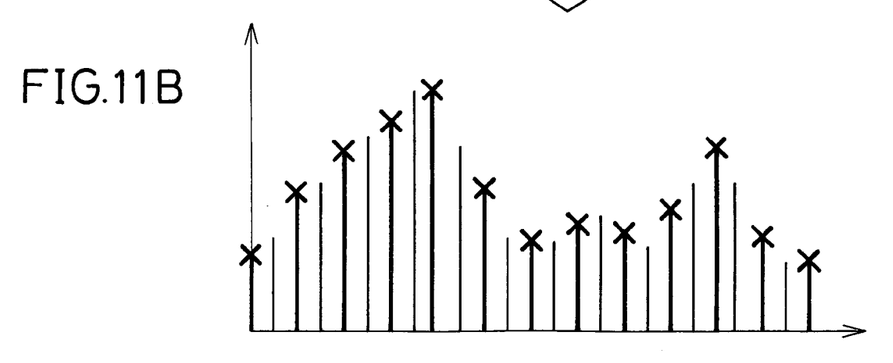

The timings of sampling of signals converted into digital signals in ADC 14 are not spaced evenly as shown in FIG. 11A. Because of this, in correction circuit 16, a predetermined number of sample points adjacent to the plurality of sample points P1, . . . , P8, . . . , not spaced evenly in FIG. 11A is selected and a correction curve that fits them is calculated by, for example, the spline interpolation method. Then, as shown in FIG. 11B, the amplitude at sampling points spaced evenly is found using the correction curve and it is output as corrected digital output signal HDout. The method of calculating a correction curve is not limited to the spline interpolation method but any interpolation method may be used.

Here, the amount of jitter of the sampling clock will be discussed, which is necessary to obtain an n-bit digital output signal. If it is assumed that analog input signal Ain is a sinusoidal wave signal as explained in FIG. 2 and the resolution of ADC 14 is n bits, (½) LSB=A/$2^{n+1}$ holds. A value of jitter at which the voltage error is (½) LSB is found. The input frequency is up to the Nyquist frequency (fin≦fs/2) and the maximum value of gradient of the input signal is $2\pi fin A$, as explained in FIG. 2A, and if the value of jitter is assumed to be δt, then the voltage error is $2\pi fin A \delta t$, and it is only required that $2\pi fin A \delta t$ be equal to or less than (½) LSM. As a result, jitter value δt will be as follows.

$$\delta t < A/(2^{n+1} 2\pi fin A) = 1/(2^{n+1} 2\pi fin)$$

Here, a case is considered in which the digital output of the AD converter is 10 bits and the sampling rate is 250 M sampling/s. When fin=125 MHz, from the above expression, $$\delta t < 0.622 \text{ ps}$$

is obtained. With the sampling clock of 250 MHz, it is very difficult to suppress jitter to this value.

However, if it is assumed that the oscillation frequency of VCO is 8 GHz and the division ratio of divider (Div) 26 is 1/32, then the frequency of sampling clock SC of S/H 14 and ADC 14 will be 250 MHz. The input frequency is assumed up to be 125 MHz, which is the Nyquist frequency. Because the oscillation frequency of VCO 24 is assumed to be 8 GHz, the period of original clock CR is 125 ps. In the first embodiment, error correction is carried out by the digital signal processing in correction circuit 16 and if TDC 27 in FIG. 8 is used, it is only required to suppress the jitter value of the original clock to within 0.62 ps. The standard deviation δt of jitter has approximately the following relationship.

$$\sigma t \propto 1/f^{1/2}$$

From this, σVCO/σsampling=$1/32^{1/2}$=0.177 is obtained. By using this relationship, the jitter of the sampling clock of a frequency equivalent to 250 MHz is about 0.62 ps/0.177=3.5 ps and the requirement for jitter can be relaxed.

Figure 12:
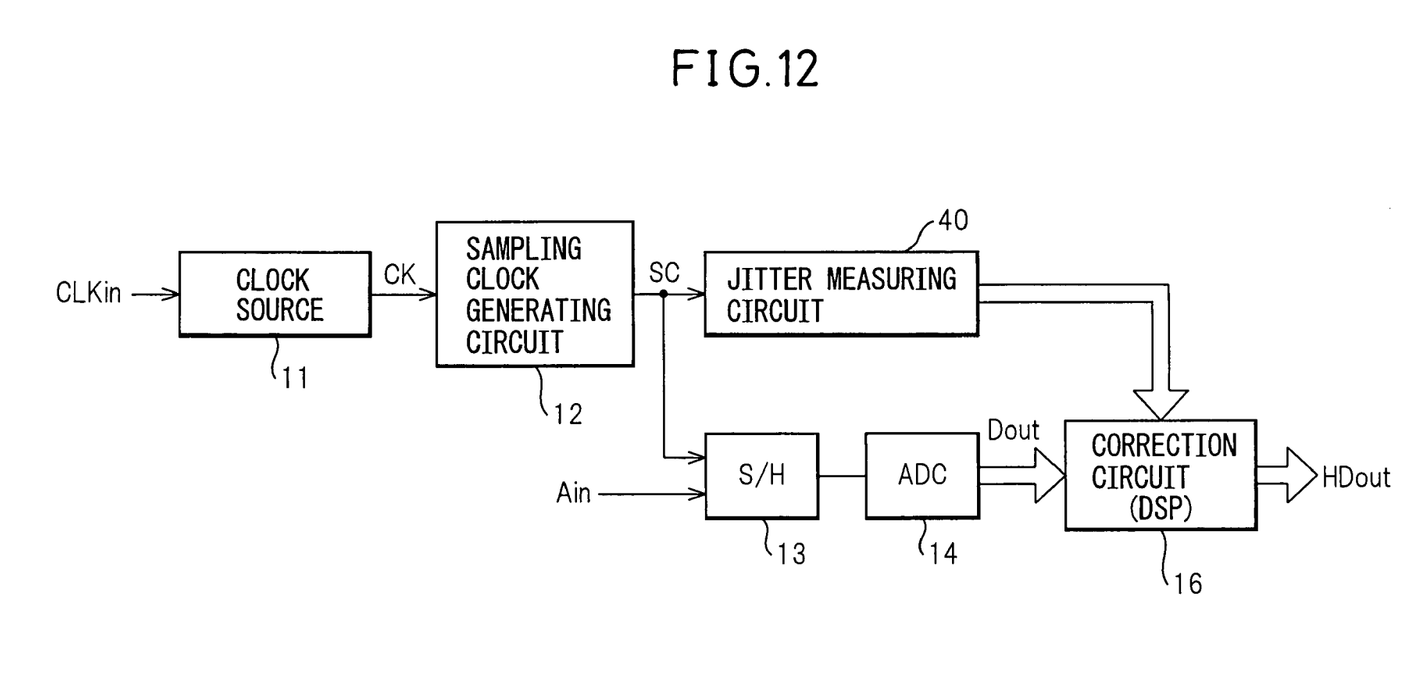
FIG. 12 is a diagram showing a configuration of an AD converter in a second embodiment.

FIG. 12 is a diagram showing the basic configuration of an analog-to-digital (AD) converter in a second embodiment of the present invention. This AD converter is also mounted, for example, on a single chip as part of SoC.

As shown in FIG. 12, the AD converter in the second embodiment has a configuration similar to that of the AD converter in the first embodiment, differing in that a jitter measuring circuit 40 measures the rise in timing of sampling clock SC with respect to the previous rise timing in the second embodiment while in the first embodiment, jitter measuring circuit 15 measures jitter with respect to original clock CK of sampling clock SC.

Figure 13A:
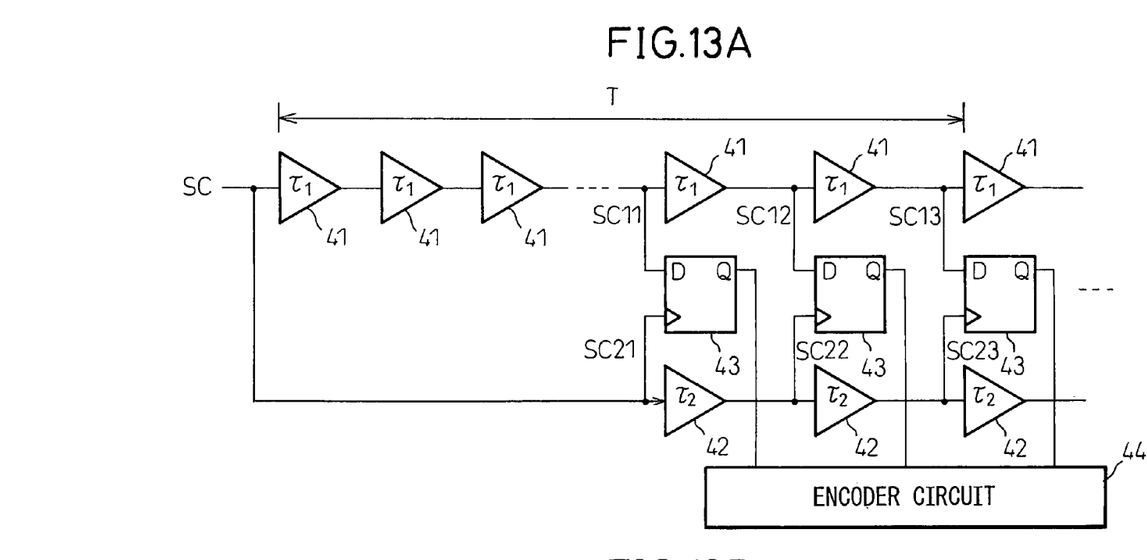
FIGS. 13A and 13B are diagrams showing a configuration and operation of a jitter measuring circuit in the second embodiment.
Figure 13B:
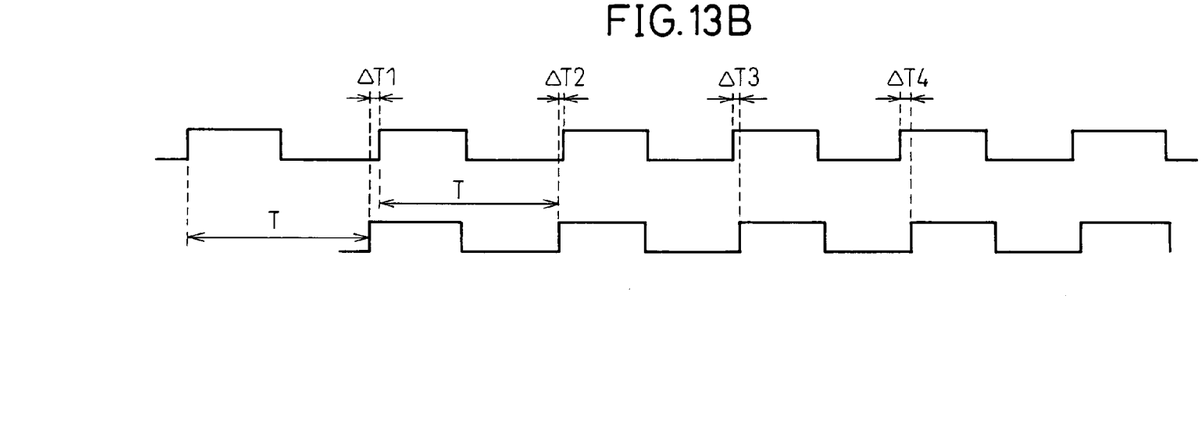

FIG. 13A and FIG. 13B are diagrams showing the configuration and operation of jitter measuring circuit 40 in the second embodiment, FIG. 13A showing a circuit configuration and FIG. 13B showing a time chart of the circuit operation.

As shown in FIG. 13A, jitter measuring circuit 40 has a first delay circuit series in which a plurality of non-inverter buffers 41 that sequentially delay sampling clock SC by first predetermined delay time ι1 are connected in series; a second delay circuit series in which a plurality of non-inverter buffers 42 that sequentially delay sampling clock SC by second predetermined delay time ι2 are connected in series; a plurality of flip-flops 43 that take delayed sampling clocks SC1, SC12, SC13, . . . , sequentially delayed by the first delay circuit series as a data input and delayed sampling clocks SC21, SC22, SC23, . . . , sequentially delayed by the second delay circuit series as a clock input; and an encoder circuit 44 that calculates the jitter of a sampling clock from the output of the plurality of flip-flops 44. Here, ι1>ι2 also holds.

The first delay circuit series has a larger number of non-inverter buffers connected than that in the second delay circuit series, and is configured so that a delay substantially the same as a period T of the sampling clock occurs in the non-inverter buffer that generates a delayed sampling clock to be input to the data of flip-flop 43. As a result, a signal whose rise timing before the sampling clock is delayed by substantially period T is input to flip-flop 43 as data, and therefore, the relationship between the previous rise timing and the current rise timing of a sampling clock, i.e., the difference between neighboring rise timings of a sampling clock is measured.

Similar to the explanation given with reference to FIG. 9A and FIG. 9B, t1>t2 holds as described above, and therefore, there exists a position at which output data Q of flip-flop 43 changes from "L" to "H" and if the position at which output data Q of flip-flop 43 changes is detected, the difference between neighboring rise timings can be found.

In the manner described above, the difference between neighboring rise in timings of sampling clock SC can be sequentially measured and thereby jitter can be measured.

Other parts are the same as those in the first embodiment.

The embodiments of the present invention are explained as above; however, it is obvious that there can be various modification examples. For example, the technique that improves the time resolution of a time digitizer, described in K. Nose, M. Kajita, M. Mizuno, "A 1 ps-Resolution Jitter-Measurement Macro Using Interpolated Jitter Oversampling", IEEE JSSC, vol. 41, no. 12, pp. 2911-2920 (December 2006), J. Rivoir, "Fully-Digital Time-to-Digital Converter for ATE with Autonomous Calibration", IEEE International Test Conference, santa Clara, (October 2006), J. Rivoir, "Statistical Linearity Calibration of Time-to-Digital Converters Using a Free-Running Ring Oscillator", 15th Asian Test Symposium (2006), can be applied to the present invention.

The present invention can be applied to any analog-to-digital (AD) converter and AD conversion method, and in particularly, the present invention is suitable to the application to an AD converter that outputs digital data of high resolution at high speed sampling.

We claim:

1. An AD converter comprising:
   an analog-to-digital (AD) conversion part that samples an analog signal according to a sampling clock and converts the sampled analog signal into a digital signal;
   a jitter measuring circuit that measures the jitter of the sampling clock; a correction circuit that corrects the digital signal output by the AD conversion part based on the jitter measured by the jitter measuring circuit;
   a clock source that generates a clock; and
   a sampling clock generating circuit that divides the clock generated by the clock source and generates the sampling clock, wherein
   the jitter measuring circuit measures the jitter of the sampling clock with respect to the clock on the basis of the clock.

2. The AD converter according to claim 1, wherein the jitter measuring circuit comprises:
   a first delay circuit series in which a plurality of delay circuits that sequentially delay the clock by a first delay time are connected in series;
   a plurality of flip-flops that take each delayed clock sequentially delayed by the first delay circuit series as a data input and the sampling clock as a clock input; and
   an encoder circuit that calculates the jitter of the sampling clock with respect to the clock from the output from the plurality of flip-flops.

3. The AD converter according to claim 2, wherein:
   the jitter measuring circuit comprises a second delay circuit series in which a plurality of delay circuits that sequentially delay the sampling clock by a second delay time shorter than the first delay time are connected in series; and
   the plurality of flip-flops take each delayed clock as a data input and each delayed sampling clock sequentially delayed by the second delay circuit series as a clock input.

4. The AD converter according to claim 2, wherein:
   the clock source is a PLL circuit or a DLL circuit that has an original clock delay circuit series in which a plurality of delay circuits that sequentially delay the clock are connected in series; and
   the first delay circuit series and the original clock delay circuit series share a part thereof.

* * * * *